(12) United States Patent
Okabe et al.

(10) Patent No.: US 8,810,765 B2
(45) Date of Patent: Aug. 19, 2014

(54) ELECTROLUMINESCENCE ELEMENT

(75) Inventors: Tohru Okabe, Osaka (JP); Hirohiko Nishiki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1016 days.

(21) Appl. No.: 12/527,731

(22) PCT Filed: Jan. 11, 2008

(86) PCT No.: PCT/JP2008/050228
§ 371 (c)(1),
(2), (4) Date: Aug. 19, 2009

(87) PCT Pub. No.: WO2008/139746
PCT Pub. Date: Nov. 20, 2008

(65) Prior Publication Data
US 2010/0044733 A1   Feb. 25, 2010

(30) Foreign Application Priority Data

May 15, 2007   (JP) ................................. 2007-129061

(51) Int. Cl.
*G02F 1/1339* (2006.01)
*H05B 33/04* (2006.01)
*H01L 51/52* (2006.01)
*H01L 27/32* (2006.01)
*H05B 33/22* (2006.01)

(52) U.S. Cl.
CPC ............... *H05B 33/22* (2013.01); *H05B 33/04* (2013.01); *H01L 51/5237* (2013.01); *H01L 27/3246* (2013.01); *H01L 2251/5338* (2013.01)
USPC ............... 349/156; 257/52; 257/53; 257/57; 257/59; 257/66; 257/69; 257/72; 257/184; 257/E51.005; 257/E21.053; 257/E27.13; 349/56; 349/58; 349/69; 349/153; 349/155; 345/36; 345/44; 345/45; 345/46; 345/55; 345/76; 345/87; 345/92; 438/28; 438/29; 438/30; 438/34; 438/69

(58) Field of Classification Search
CPC . H01L 27/1214; H01L 27/12; H01L 27/3246; H01L 51/5237; H01L 27/3251; H01L 51/52
USPC ............... 257/52, 53, 57, 59, 66, 69, 72, 184, 257/192, 291, E51.005, E21.053, E27.13; 445/24, 25; 349/56, 58, 69, 153, 155, 349/156; 345/36, 44–46, 55, 76, 87, 92; 438/28–30, 34, 69
See application file for complete search history.

(56) References Cited

U.S. PATENT DOCUMENTS 5,699,139 A     12/1997  Aastuen et al.
2005/0094071 A1* 5/2005  Akiyama et al. .............. 349/122
2005/0140291 A1 6/2005  Hirakata et al.

FOREIGN PATENT DOCUMENTS

JP   2003-077679 A   3/2003
JP   2004-077861 A   3/2004
(Continued)

OTHER PUBLICATIONS

Official Communication issued in International Patent Application No. PCT/JP2008/050228, mailed on Feb. 12, 2008.

*Primary Examiner* — Meiya Li
(74) *Attorney, Agent, or Firm* — Keating & Bennett, LLP

(57) ABSTRACT

An electroluminescence element includes an electroluminescence substrate including a thin film transistor substrate, and a light-emitting layer provided over the thin film transistor substrate and divided by picture-element separating portions so as to correspond to unit picture elements; and a sealing substrate arranged to hermetically seal the light-emitting layer of the electroluminescence substrate. At least one of the electroluminescence substrate and the sealing substrate is a flexible substrate. Spacers are provided between the electroluminescence substrate and the sealing substrate.

9 Claims, 2 Drawing Sheets

(56) References Cited

FOREIGN PATENT DOCUMENTS

| | | |
|---|---|---|
| JP | 2004-281085 A | 10/2004 |
| JP | 2004-319118 A | 11/2004 |
| JP | 2005-156807 A | 6/2005 |
| JP | 2005-166315 A | 6/2005 |
| JP | 2005-339863 A | 12/2005 |
| JP | 2007-005160 A | 1/2007 |
| WO | 97/02509 A1 | 1/1997 |

* cited by examiner

ELECTROLUMINESCENCE ELEMENT

BACKGROUND OF THE INVENTION

1. Field of the Invention

The present invention relates to an electroluminescence element.

2. Description of the Related Art

Electroluminescence elements which are formed on normal glass substrates have two glass substrates: a glass substrate on which a light-emitting layer is formed; and a glass substrate on which a moisture absorbent material is formed. The two glass substrates are bonded together along their periphery with a sealing resin.

In general, an electroluminescence element emits light by applying a current in a very thin light-emitting layer as thin as about 100 nm. Thus, if the light-emitting layer has fine concaves and convexes on its surface, leakage may occur between an anode and a cathode in the element. Therefore, an anode picture-element pattern, which is formed in each picture element on active circuits, such as thin film transistors, needs to be designed and manufactured with flatness of a nanometer level. Such an electroluminescence element is characterized by its high susceptibility to physical damage due to contact, force or impact.

On the other hand, attempts have been made to form a thin film device on a light-weight, highly flexible substrate such as a plastic substrate, instead of on a glass substrate. Thus, flexible displays using electroluminescence elements have attracted great attention.

For example, Japanese Published Patent Application No. 2005-339863, Japanese Published Patent Application No. 2003-77679, or the like is disclosed as a flexible display using an electroluminescence element.

Conventional electroluminescence elements formed on flexible substrates generally use two kinds of element structures.

The first element structure is a structure in which two plastic substrates are bonded together. In this structure, two plastic substrates, that is, two flexible substrates, are bonded together. Thus, when bending the laminate of the substrates, the surface of a light-emitting layer is brought into contact with the opposing substrate, because the substrates are fixed with a sealing resin along their periphery. Such contact can destroy the very sensitive light-emitting layer, causing problems such as leakage defects and defective light-emission. In addition to bending the laminate of the substrates, if a force is applied to the surfaces of the plastic substrates, the light-emitting layer is brought into contact with the opposing substrate due to deformation of the plastic substrates, thereby causing similar problems such as leakage defects and defective light-emission.

The second element structure is formed by a plastic substrate having TFTs (Thin Film Transistors), an interlayer insulating film, an anode, an insulating film for insulating picture elements from each other, a light-emitting layer, a cathode, and a sealing film.

Such an electroluminescence element uses a sealing film such as a CVD (Chemical Vapor Deposition) film instead of the sealing substrate, and is advantageous in that the electroluminescence element can be formed by using only one flexible substrate. However, an organic material, such as a plastic substrate and a light-emitting layer for use in an electroluminescence element, generally agglomerates to form foreign particles during manufacturing, thereby forming protrusions. Leakage defects tend to be generated if such protrusions formed by the foreign particles are produced in a portion insulated by the very thin light-emitting layer. Such leakage defects are repaired by a so-called laser repair process, i.e., a process of applying laser light to remove electrodes in the regions corresponding to the protrusions. However, since the sealing resin is located directly above the cathode, performing the laser repair process on a conventional electroluminescence element having an element structure destroys the sealing film, causing problems such as a failure to accurately remove the electrodes.

SUMMARY OF THE INVENTION

In view of the above problems, preferred embodiments of the present invention provide an electroluminescence element capable of desirably preventing contact between a light-emitting layer and an opposing substrate or the like due to deformation of a substrate or the like, and capable of accurately laser-repairing leakage defects caused by the presence of foreign particles or the like.

An electroluminescence element according to a preferred embodiment of the present invention includes an electroluminescence substrate which includes a TFT substrate, and a light-emitting layer provided over the TFT substrate and divided by picture-element separating portions so as to correspond to unit picture elements. The electroluminescence element further includes a sealing substrate for hermetically sealing the light-emitting layer of the electroluminescence substrate. At least one of the electroluminescence substrate and the sealing substrate is a flexible substrate. Spacers are provided between the electroluminescence substrate and the sealing substrate.

According to the above structure, since at least one of the electroluminescence substrate and the sealing substrate of the electroluminescence element is a flexible substrate, and the spacers are provided between the electroluminescence substrate and the sealing substrate, the presence of the spacers prevents the surface of the light-emitting layer from contacting the opposing sealing substrate even if the electroluminescence element is deformed by a bending stress, a pressing force, or the like. Thus, freely-deformable next-generation displays can be manufactured by making the most of the characteristics of flexible substrates such as a plastic substrate. Moreover, since a gap is produced between electrodes and the sealing substrate by the presence of the spacers, leakage defects or the like, which are caused by foreign particles generated during manufacturing of the element, can be accurately laser-repaired, whereby the yield can be significantly improved.

Various preferred embodiments of the present invention provide an electroluminescence element capable of preventing contact between a light-emitting layer and an opposing substrate due to deformation of a substrate or the like, and capable of accurately laser-repairing leakage defects caused by the presence of foreign particles or the like.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

Although preferred embodiments of the present invention will be described in detail below by referencing the accompanying drawings, the present invention is not limited to the following preferred embodiments.

An electroluminescence element 10 according to a preferred embodiment of the present invention will be described in detail by referencing the drawings. Note that the electroluminescence element 10 according to the present preferred embodiment of the present invention may either be an organic electroluminescence element which has a light-emitting layer formed by an organic electroluminescence layer, or an inorganic electroluminescence element which has a light-emitting layer formed by an inorganic electroluminescence layer.
Structure of the Electroluminescence Element 10

Figure 1:
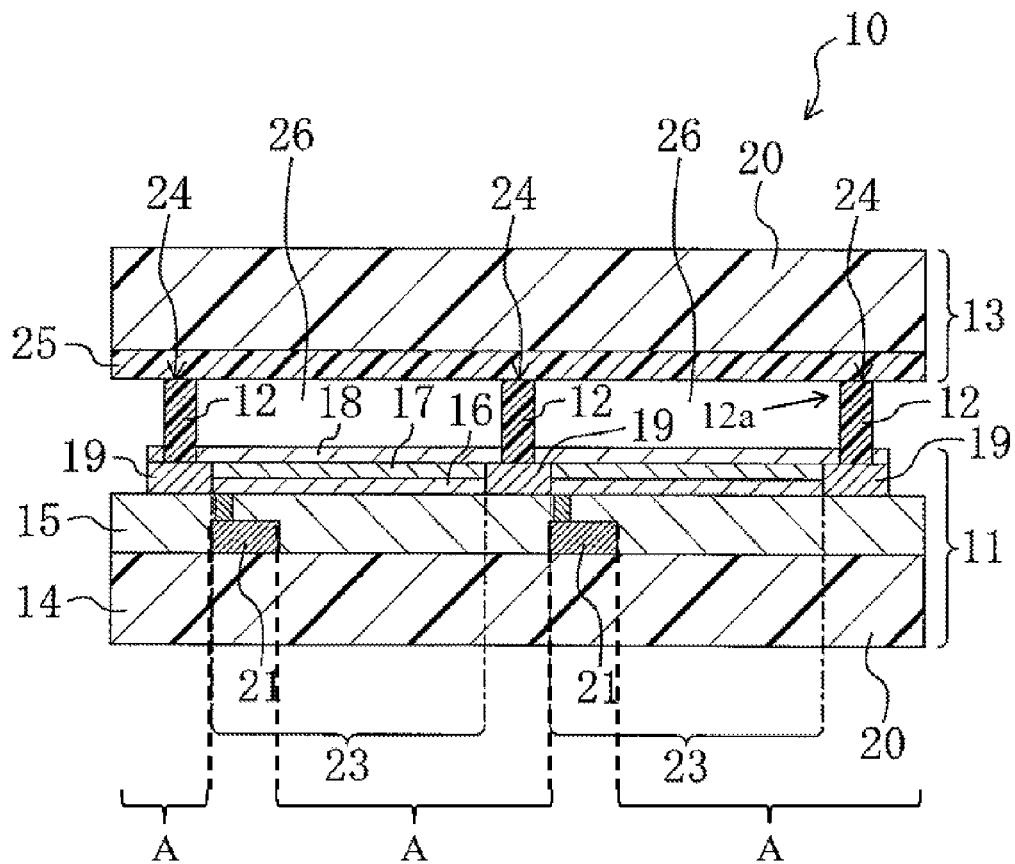
FIG. 1 is a cross-sectional view of an electroluminescence element.

As shown in FIG. 1, the electroluminescence element 10 according to the present preferred embodiment of the present invention preferably includes an electroluminescence substrate 11, spacers 12, and a sealing substrate 13.

The electroluminescence substrate 11 preferably includes a TFT (Thin Film Transistor) substrate 14, an interlayer insulating film 15, an anode 16, a light-emitting layer 17, picture-element separating portions 19, and a cathode 18.

The TFT substrate 14 includes a flexible base material 20, such as a plastic base material or a metal base material, which includes a moisture-permeable barrier film. TFTs 21 for controlling display driving of each picture element of the light-emitting layer 17 are formed on the flexible base material 20. The TFTs 21 are formed by polysilicon TFTs or amorphous silicon TFTs. Note that description of transistors for compensating for the threshold voltage and the mobility of driving TFTs, selection transistors, and the like is omitted in the present preferred embodiment.

The flexible base material 20 is formed so that the base material thickness in a non-formation region of the light-emitting layer 17 (a region where no light-emitting layer 17 is formed) is smaller than that in a formation region of the light-emitting layer 17 (a region where the light-emitting layer 17 is formed).

The interlayer insulating film 15 is formed over the TFT substrate 14. The interlayer insulating film 15 planarizes concaves and convexes on the TFT substrate 14. The interlayer insulating film 15 is formed by a transparent organic insulating film such as an acrylic resin.

The anode 16 is formed on the interlayer insulating film 15. The anode 16 is divided by the plurality of picture-element separating portions 19 so as to correspond to the unit picture elements 23 of the light-emitting layer 17. The picture-element separating portions 19 are made of a black resin or the like in order to prevent color mixture when light is emitted in the picture elements. The anode 16 is formed by, for example, a transparent electrode made of indium tin oxide (ITO), indium zinc oxide (IZO), or the like. The portions of the anode 16 divided by the plurality of picture-element separating portions 19 are electrically connected to the TFTs 21 of the TFT substrate 14, respectively.

The light-emitting layer 17 is formed on the anode 16. The light-emitting layer 17 is formed by a plurality of unit picture elements 23 of, for example, red, green, blue, and the like arranged in a matrix pattern, and a plurality of picture-element separating portions 19 each provided between adjacent unit picture elements 23. In other words, the picture elements of the light-emitting layer 17 are divided by the picture-element separating portions 19 so that each picture element corresponds to a plurality of unit picture elements 23. However, in the case where the light-emitting layer 17 of the same color is controlled in a line pattern, the light-emitting layer 17 and the picture-element separating portions 19 are formed in a line pattern. The light-emitting portion 17 is made of an organic EL (electroluminescence) layer or an inorganic EL layer.

The cathode 18 is formed on the light-emitting layer 17. The cathode 18 is preferably made of, for example, a metal including aluminum, platinum, gold, iridium, palladium, silver, and nickel, an alloy of these metals, or the like.

A plurality of spacers 12 are provided between the electroluminescence substrate 11 and the sealing substrate 13. More specifically, the plurality of spacers 12 are respectively formed on the picture-element separating portions 19 of the electroluminescence substrate 11, and extend toward the opposing sealing substrate 13 so that their respective tips 12a face the sealing substrate 13. One spacer 12 is formed on each picture-element separating portion 19 between adjacent unit picture elements 23 of the light-emitting layer 17. The spacers 12 are formed over the TFT substrate 14 only in a region which is located both in a non-formation region of the TFTs 21 (corresponding to all portions of the electroluminescence element 10 that do not overlap the TFTs 21 in plan view, indicated as "A" in FIG. 1) and in the formation region of the light-emitting layer 17. The spacers 12 are made of, for example, an elastic photosensitive resin material. An elastic material such as an acrylic resin or a silicone resin is preferably used for the spacers 12. Sliding portions 24 are formed by performing, for example, a process of reducing the coefficient of friction, on the tips 12a of the spacers 12 which are located on the opposing sealing substrate 13 side.

Note that the spacers 12 may be formed on the sealing substrate 13. In this case, a plurality of spacers 12 can be arranged so as to extend from the sealing substrate 13 toward the electroluminescence substrate 11, and the sliding portions can be formed at the tips of the spacers 12 which are located on the electroluminescence substrate 11 side.

In this case as well, the spacers 12 need to be in contact with the plurality of picture-element separating portions 19, and are accurately aligned when the TFT substrate 14 and the sealing substrate 13 are bonded together.

The sealing substrate 13 is formed by the flexible base material 20 and a moisture absorbent material 25, and is positioned so as to face the electroluminescence substrate 11 to hermetically seal the light-emitting layer 17. A gap 26 of a predetermined width, which is defined by the spacers 12, is formed between the electroluminescence substrate 11 and the sealing substrate 13.

The flexible base material 20 is preferably formed by a plastic base material, a metal base material, or the like which includes a moisture-permeable barrier film.

The moisture absorbent material 25 is formed on the surface of the electroluminescence substrate 11 side of the flexible base material 20. The moisture absorbent material 25 has an adhesive property in addition to the moisture absorbing property, and forms an adhesive portion. The moisture absorbent material 25 is formed by coating the surface of a thin film material, which contains, for example, adsorptive inorganic powder such as barium oxide or silica, with an adhesive. The moisture absorbent material 25 has a sliding portion which is formed by performing, for example, a process of reducing the coefficient of friction, on the surface of the opposing electroluminescence substrate 11 side of the moisture absorbent material 25.

Manufacturing Method of the Electroluminescence Element 10

An example of a manufacturing method of the electroluminescence element 10 according to a preferred embodiment of the present invention will be described below.

First, a flexible base material 20, which is made of a plastic material or the like and has a thickness of, for example, about 0.2 mm, is prepared. A light-emitting layer 17 is formed in a later step, and the flexible base material 20 is formed as thin as about 0.1 mm in a region other than a region where the light-emitting layer 17 is to be formed.

Then, TFTs 21 for driving the electroluminescence element 10 are formed on the flexible base material 20 by a common manufacturing process, thereby manufacturing a TFT substrate 14.

Then, in order to planarized concaves and convexes on the TFT substrate 14, an interlayer insulating film 15 is formed with a thickness of, for example, about 1.0 μm to about 5.0 μm over the TFT substrate 14.

Then, an ITO film or the like is deposited with a thickness of, for example, about 100 nm to about 200 nm on the interlayer insulating film 15 by a sputtering method or the like. Then, the deposited ITO film or the like is processed into a predetermined electrode wiring pattern (a predetermined pattern excluding the positions where unit picture elements 23 are to be formed) by a photolithography technique or the like, thereby forming an anode 16.

Then, a plurality of picture-element separating portions 19 are formed between the anodes 16 of the predetermined electrode wiring pattern. At this time, the picture-element separating portions 19 are positioned in a predetermined pattern excluding the positions where the unit picture elements 23 are to be formed. The picture-element separating portions 19 are formed with a thickness which is about the same as the total height of the picture element 23 and the light-emitting layer 17 formed thereon. Moreover, the picture-element separating portions 19 are formed in a tapered shape in order to prevent disconnection of the cathode 18.

Then, a plurality of spacers 12 are formed with a height of, for example, about 3 μm, so as to stand up from the respective picture-element separating portions 19. This structure is desirable because the electroluminescence element having the spacers 12 of a smaller height is easier to bend. The spacers 12 are accurately positioned by applying a photosensitive resin and performing a stepper exposure process and a development process.

Then, a light-emitting layer 17 of, for example, red, green, and blue is selectively formed on the anode 16 between adjacent picture-element separating portions 19 by an inkjet method or a vacuum mask vapor deposition method.

Then, an aluminum film or the like is deposited with a thickness of, for example, about 100 nm to about 200 nm on the light-emitting layer 17 by a vacuum mask vapor deposition method or the like, thereby fabricating an electroluminescence substrate 11.

Then, a sealing substrate 13, which is formed by attaching a moisture absorbent material 25 to a flexible base material 20 made of a plastic material and having a thickness of, for example, about 2.0 mm, is bonded to the electroluminescence substrate 11, while performing nitrogen substitution so that no moisture enters the light-emitting layer 17 of the electroluminescence substrate 11. At this time, the sealing substrate 13 and the electroluminescence substrate 11 are firmly bonded together by applying an epoxy sealing resin 29 to the peripheries of both substrates, and curing the sealing resin 29 by UV (ultraviolet) radiation.

The electroluminescence element 10 is fabricated in this manner.

Figure 2:
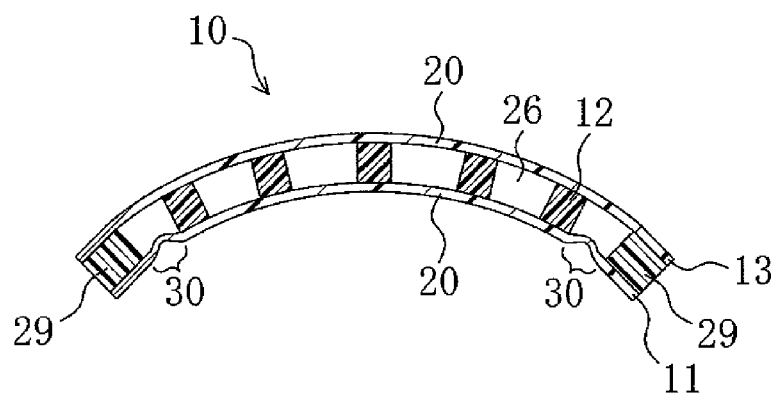
FIG. 2 is a schematic view showing a state in which a bending stress is applied to the electroluminescence element.

FIG. 2 is a schematic diagram showing a state in which a stress such as a bending stress or a pressing force is applied to the electroluminescence element 10 fabricated as described above. As shown in FIG. 2, even when the electroluminescence element 10 is deformed, the spacers 12 provided between the electroluminescence substrate 11 and the sealing substrate 13 form a gap 26 of a predetermined width. Thus, the light-emitting layer 17 is not pressed against the sealing substrate 13, and generation of defects in the light-emitting layer 17 is prevented desirably.

The flexible base material 20 may be formed as thin as about 0.1 mm, for example, in a non-formation region 30 of the light-emitting layer 17. This facilitates deformation of the non-formation region of the light-emitting layer 17, and as a result, facilitates formation of the electroluminescence element 10 itself.

Laser Repair Method of the Electroluminescence Element 10

A laser repair method will be described below with respect to the case where the electroluminescence element 10 fabricated as described above has a bright-spot-defect portion 31 caused by generation of a foreign particle 32.

Figure 3:
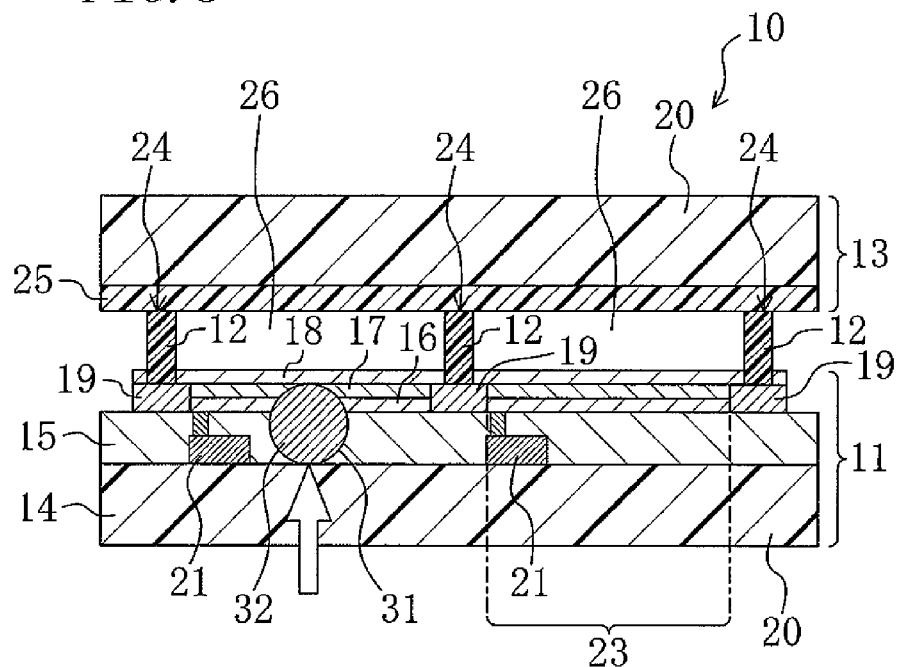
FIG. 3 is a cross-sectional view of the electroluminescence element having a bright-spot-defect portion.

First, as shown in FIG. 3, the electroluminescence element 10 having the bright-spot-defect portion 31 is observed by an optical microscope, or a slight voltage is applied to this electroluminescence element 10 so as to turn on all the pixels. The presence of a non-light-emitting pixel is confirmed in this manner. The position of this non-light-emitting pixel corresponds to the position of the bright-spot-defect portion 31 inside the element.

Then, the bright-spot-defect portion 31 is laser-repaired by using, for example, a femtosecond laser repair apparatus or the like.

Figure 4:
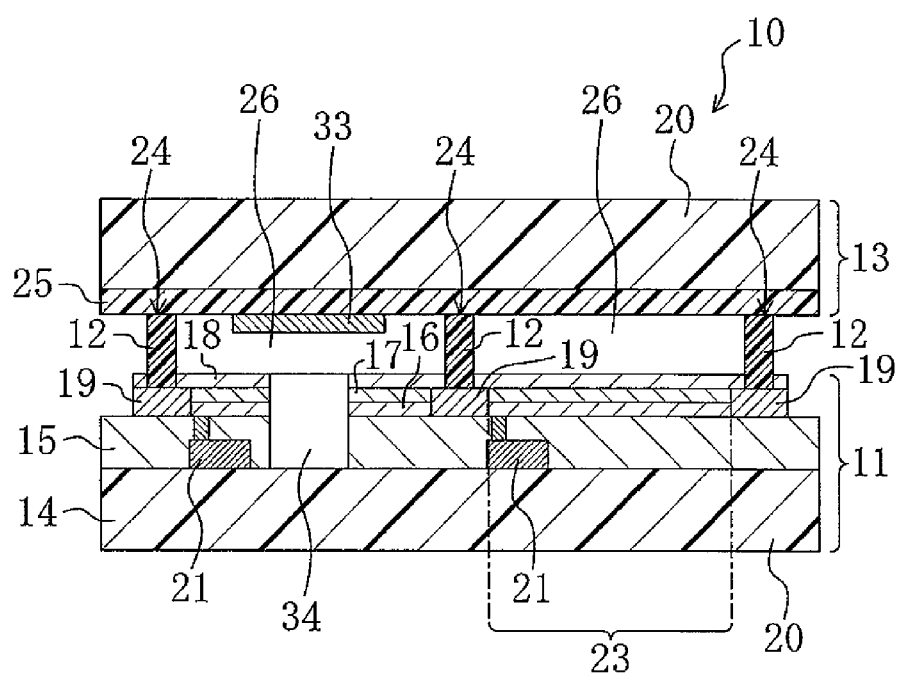
FIG. 4 is a cross-sectional view of the electroluminescence element having a void portion formed in a light-emitting layer.

Femtosecond laser light is laser light of a variable-pulse excitation laser mounted on a microscope, and its oscillation wavelength can be arbitrarily selected. Femtosecond laser light of, for example, a medium wavelength (700 nm to 900 nm, preferably 780 nm) is applied in the direction shown by arrow in FIG. 3, that is, from the back side of the electroluminescence substrate 11 toward the bright-spot-defect portion 31. The focus of the laser light may be located at any position, but is set to the anode 16 corresponding to the position of the bright-spot-defect portion 31 in order to implement, for example, low-damage repair. As shown in FIG. 4, application of the femtosecond laser light causes multi-photon absorption in the region corresponding to the position of the bright-spot-defect portion 31 in the anode 16, thereby forming a void portion 34. Prevention of leakage is implemented in this manner. The focus of the repair process is not limited to the anode 16, but may be set to, for example, the light-emitting layer 17 so that the void portion 34 is formed in the light-emitting layer 17.

At this time, the foreign particle 32 and the anode 16, the light-emitting layer 17 or the like, scattered by the application of laser light, adhere to the adhesive, moisture absorbent material 25 of the sealing substrate 13, thereby forming a laser removal film 33. This can desirably prevent secondary leakage which is caused by further scattering of the foreign particle 32 and the anode 16, the light-emitting layer 17 or the like, scattered by the laser repair process, to other locations.

Functions, effects and advantages will be described below.

The electroluminescence element 10 according to a preferred embodiment of the present invention preferably includes: the electroluminescence substrate 11 including the TFT substrate 14, and the light-emitting layer 17 provided over the TFT substrate 14 and divided by picture-element separating portions 19 so as to correspond to unit picture elements 23; and the sealing substrate 13 arranged to hermetically seal the light-emitting layer 17 of the electroluminescence substrate 11. At least one of the electroluminescence substrate 11 and the sealing substrate 13 is a flexible substrate, and the spacers 12 are provided between the electroluminescence substrate 11 and the sealing substrate 13.

According to the above structure, since at least one of the electroluminescence substrate 11 and the sealing substrate 13 of the electroluminescence element 10 is a flexible substrate, and the spacers 12 are provided between the electroluminescence substrate 11 and the sealing substrate 13, the presence of the spacers 12 prevents the surface of the light-emitting layer 17 from contacting the opposing sealing substrate 13 even if the electroluminescence element 10 is deformed by a bending stress, a pressing force, or the like. Thus, freely-deformable next-generation displays can be manufactured by making the most of the characteristics of flexible substrates such as a plastic substrate. Moreover, since a gap is produced between electrodes and the sealing substrate 13 by the presence of the spacers 12, leakage defects or the like, which are caused by foreign particles generated during manufacturing of the element, can be accurately laser-repaired, whereby the yield can be significantly improved.

Moreover, in the electroluminescence element 10, the spacers 12 are formed on the electroluminescence substrate 11.

According to the above structure, since the spacers 12 are formed on the electroluminescence substrate 11, misalignment of the substrates in the substrate bonding process can be prevented by forming the spacers 12 at predetermined positions before the substrate bonding step. Thus, the spacers 12 can be accurately formed in the electroluminescence element 10.

Moreover, in the electroluminescence element 10, the spacers 12 are formed on the picture-element separating portions 19.

According to the above structure, since the spacers 12 are formed on the picture-element separating portions 19, leakage defects between electrodes, which are caused by the edges of the spacers 12 or the like being located in a thin layer of the picture elements, can be prevented desirably.

Moreover, in the electroluminescence element 10, at least one spacer 12 is formed in each picture-element separating portion 19 located between adjacent unit picture elements.

According to the above structure, since at least one spacer 12 is formed in each picture-element separating portion 19 located between adjacent unit picture elements, the pressure resistance of the electroluminescence element 10 is increased. Thus, the light-emitting layer 17 can be desirably prevented from contacting the opposing sealing substrate 13 even when a large bending stress or the like is applied to the electroluminescence element 10.

Moreover, in the electroluminescence element 10, the spacers 12 are formed only in a non-formation region of TFTs in the TFT substrate 14.

According to the above structure, since the spacers 12 are formed only in the non-formation region of TFTs in the TFT substrate 14, damages to the TFTs can be desirably prevented when, for example, a load is applied to the electroluminescence element 10.

Moreover, in the electroluminescence element 10, the spacers 12 are formed only in a formation region of the light-emitting layer 17.

According to the above structure, since the spacers 12 are preferably provided only in the formation region of the light-emitting layer 17, a non-formation region of the light-emitting portion 17 serves as a stress relaxing portion when a bending stress or the like is applied to the electroluminescence element 10. Thus, the electroluminescence element 10 can be bent in a desirable manner.

Moreover, in the electroluminescence element 10, the spacers 12 are preferably made of an elastic material.

According to the above structure, since the spacers 12 are made of an elastic material, the spacers 12 can absorb a stress applied thereto when a pressing force or the like is applied to the electroluminescence element 10. Thus, damages to the spacers 12 can be prevented desirably.

Moreover, in the electroluminescence element 10, each of the spacers 12 has a sliding portion 24 formed at its tip located on an opposing electroluminescence substrate 11 side or an opposing sealing substrate 13 side.

According to the above structure, each of the spacers 12 has a sliding portion 24 formed at its tip located on the opposing electroluminescence substrate 11 side or the opposing sealing substrate 13 side. Thus, when a bending stress or the like is applied to the electroluminescence element 10, the frictional force between the substrate having no spacer 12 formed thereon and the spacers 12 is reduced, and the substrate and the spacers 12 can easily slide with respect to each other. Thus, the electroluminescence element 10 can be deformed in a desirable manner.

Moreover, in the electroluminescence element 10, the spacers 12 are preferably made of a photosensitive resin material.

According to the above structure, since the spacers 12 are preferably made of a photosensitive resin material, the spacers 12 can be accurately positioned with respect to a fine picture-element pattern designed on the order of several micrometers.

Moreover, in the electroluminescence element 10, the flexible substrate has a smaller substrate thickness in a non-formation region of the light-emitting layer 17 than in a formation region of the light-emitting layer 17.

According to the above structure, since the flexible substrate has a smaller substrate thickness in the non-formation region of the light-emitting layer 17 than in the formation region of the light-emitting layer 17, deformation of the non-formation region of the light-emitting layer 17 is facilitated. This facilitates deformation of the electroluminescence element 10 itself.

Moreover, in the electroluminescence element 10, the sealing substrate 13 has an adhesive portion 25 on its surface located on an electroluminescence substrate 11 side.

According to the above structure, since the sealing substrate 13 has the adhesive portion 25 on its surface located on the electroluminescence substrate 11 side, foreign particles and a thin film, which are scattered when laser-repairing leakage defects, adhere to the adhesive portion 25. This can desirably prevent secondary leakage which is caused by further scattering of the foreign particles, the thin film and the like, scattered by the laser repair process, to other locations.

Moreover, in the electroluminescence element 10, the adhesive portion 25 has a moisture absorbing property.

According to the above structure, since the adhesive portion 25 has a moisture absorbing property, moisture degradation of the element can be prevented. Moreover, since a moisture absorbent material and the adhesive portion 25 need not be provided separately, the required space is small, and the manufacturing cost can further be reduced.

Moreover, in the electroluminescence element 10, the adhesive portion 25 has a sliding portion 24 on its surface located on an electroluminescence substrate 11 side.

According to the above structure, the adhesive portion 25 has the sliding portion 24 on its surface located on the electroluminescence substrate 11 side. Thus, when a bending stress or the like is applied to the electroluminescence element 10, the frictional force between the surface of the adhesive portion 25 and the spacers 12 is reduced, and the adhesive portion 25 and the spacers 12 can easily slide with respect to each other. Thus, the electroluminescence element 10 can be deformed in a desirable manner.

As described above, the present invention relates to an electroluminescence element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An electroluminescence element, comprising:
    an electroluminescence substrate including a thin film transistor substrate, and a light-emitting layer provided over the thin film transistor substrate and divided by picture-element separating portions so as to correspond to unit picture elements; and
    a sealing substrate arranged to hermetically seal the light-emitting layer of the electroluminescence substrate; wherein
    at least one of the electroluminescence substrate and the sealing substrate is a flexible substrate;
    spacers are provided between the electroluminescence substrate and the sealing substrate; and
    each of the spacers includes a sliding portion arranged at a tip portion of the spacer, the tip portion of the spacer is located either on a side of the spacers opposing the electroluminescence substrate or on a side of the spacers opposing the sealing substrate, the sliding portion being defined by a portion of the spacer that has a reduced coefficient of friction as compared to other portions of the spacer.

2. The electroluminescence element of claim 1, wherein the spacers are located on the electroluminescence substrate.

3. The electroluminescence element of claim 1, wherein each of the spacers is located on a respective one of the picture-element separating portions such that each of the picture-element separating portions includes one of the spacers.

4. The electroluminescence element of claim 1, wherein at least one spacer of the spacers is provided on each one of the picture-element separating portions, the picture-element separating portions being located adjacent to the unit picture elements such that at least some of the picture-element separating portions are respectively provided between adjacent unit picture elements.

5. The electroluminescence element of claim 1, wherein the spacers are located only in a non-formation region of thin film transistors of the thin film transistor substrate.

6. The electroluminescence element of claim 1, wherein the spacers are made of an elastic material.

7. The electroluminescence element of claim 1, wherein the spacers are made of a photosensitive resin material.

8. The electroluminescence element of claim 1, wherein the sealing substrate includes an adhesive portion on a surface of the sealing substrate, the surface of the sealing substrate is located on a side of the sealing substrate opposed to the electroluminescence substrate; and
    the adhesive portion includes an additional sliding portion on a surface of the adhesive portion, the surface of the adhesive portion is located on the side of the adhesive portion opposed to the electroluminescence substrate.

9. The electroluminescence element of claim 8, wherein the adhesive portion has a moisture absorbing property.

\* \* \* \* \*